(12) United States Patent  
Graichen

(10) Patent No.: US 8,021,719 B2
(45) Date of Patent: Sep. 20, 2011

(54) METHOD FOR MASKING COOLING HOLES AND DEVICE FOR USING IN A MASKING PROCESS FOR MASKING COOLING HOLES

(75) Inventor: Andreas Graichen, Norrköping (SE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/672,426

(22) PCT Filed: Feb. 19, 2009

(86) PCT No.: PCT/EP2009/051956
§ 371 (c)(1),
(2), (4) Date: Feb. 5, 2010

(87) PCT Pub. No.: WO2009/112333
PCT Pub. Date: Sep. 17, 2009

(65) Prior Publication Data
US 2011/0086169 A1      Apr. 14, 2011

(30) Foreign Application Priority Data

Mar. 14, 2008   (EP) ................................. 08004817

(51) Int. Cl.
*B05D 1/32*        (2006.01)
*B05C 7/04*        (2006.01)
(52) U.S. Cl. ........ 427/282; 427/235; 427/238; 427/287; 118/504; 118/101; 118/301

(58) Field of Classification Search .................. 427/287, 427/239, 235; 118/101, 301, 504
See application file for complete search history.

(56) References Cited

U.S. PATENT DOCUMENTS

| 2,775,101 | A | 12/1956 | Hanson |
| 7,435,353 | B2 * | 10/2008 | Golovchenko et al. ......... 216/41 |
| 2006/0125144 | A1 * | 6/2006 | Weber et al. .................. 264/309 |

FOREIGN PATENT DOCUMENTS

| DE | 4318663 | * | 10/1994 |
| DE | 4318663 | C1 | 10/1994 |
| DE | 102006029070 | B3 | 8/2007 |
| EP | 0486489 | B1 | 11/1994 |
| EP | 0412397 | B1 | 3/1998 |
| EP | 0786017 | B1 | 3/1999 |
| EP | 1306454 | A1 | 5/2003 |
| EP | 1365039 | A1 | 11/2003 |

* cited by examiner

Primary Examiner — Frederick J Parker

(57) ABSTRACT

A method of masking cooling holes of a turbine component, in particular a turbine blade or vane, for a coating process is provided. The component includes an external surface to be coated, at least one internal cavity having an opening towards the outside of the component, and cooling holes extending from the at least one internal cavity to the external surface. The method comprises the steps of: filling the cooling holes with a masking material and hardening the masking material. The masking material, water, is used to fill in the cooling holes. The hardening is done by freezing the water to water ice. A method of coating an external surface of a turbine component and a device for use in a masking process for masking cooling holes in a turbine component are also provided.

16 Claims, 2 Drawing Sheets

METHOD FOR MASKING COOLING HOLES AND DEVICE FOR USING IN A MASKING PROCESS FOR MASKING COOLING HOLES

CROSS REFERENCE TO RELATED APPLICATIONS

This application is the US National Stage of International Application No. PCT/EP2009/051956, filed Feb. 19, 2009 and claims the benefit thereof. The International Application claims the benefits of European Patent Office application No. 08004817.6 EP filed Mar. 14, 2008. All of the applications are incorporated by reference herein in their entirety.

FIELD OF INVENTION

The present invention relates to a method of masking cooling holes of a turbine component, such as a turbine blade or vane, for a coating process. In addition, the invention relates to a method of coating an external surface of a turbine component, such as a turbine blade or vane. The invention further relates to a device for using in a masking process for masking cooling holes in a turbine component and/or for using in a coating process for coating such a turbine component. The turbine component may, in particular, be a gas turbine component, such as a gas turbine blade or vane.

BACKGROUND OF INVENTION

Gas turbine components that are exposed to hot combustion gases are often coated with metallic and/or ceramic coatings to improve their heat resistance and thereby their lifetime and their operational behaviour. Examples of such coatings are MCrAlX-coatings where M stands for a metal, in particular for cobalt, nickel or iron, X stands for an active element which can, for example, be yttrium (Y) and/or silicon (Si), scandium (Sc) and/or at least one rare earth element or hafnium (Hf). Such alloys are, for example, known from EP 0 486 489 B1, EP 0 786 0 17 B1, EP 0 412 397 B1 or EP 1 306 454 A1. A thermal barrier coating (TBC) may be applied on the MCrAlY-coating. Such thermal barrier coatings are typically made from zirconium oxide ($ZrO_2$) the crystal structure of which may be partially or completely stabilised by adding yttrium oxide ($Y_2O_3$).

Furthermore, turbine components which are exposed to hot combustion gases often comprise at least one internal cavity and cooling holes extending from the internal cavity to the outside of the component. In operation of such a component a cooling fluid, e.g. cooling air, is blown out of the cooling holes to form a cooling fluid film over the component's surface to protect it from hot combustion gas.

Metallic alloy coatings or ceramic coatings are usually applied onto the surface of the component by thermal spraying methods like, e.g. atmospheric plasma spraying (APS) or high velocity oxy-fuel spraying (HVOF). In any case, during the application of the coatings the cooling holes can become reduced in their cross section area or even completely clogged. As a consequence, the cooling fluid flow efficiency through the cooling holes is reduced. Partially or fully clogged cooling holes therefore need to be reopened after the coating is applied. However, reopening of the cooling holes is a time consuming and elaborate and therefore an expensive process. In addition, cooling holes are often formed by electrical discharge machining (EDM) which cannot be used after coating the component with an electrically isolating ceramic coating.

Due to the mentioned difficulties it has been proposed to mask the cooling holes during the coating process. EP 1 365 039 A1 describes a process of masking cooling holes of a gas turbine component in which the cooling holes are filled with a polymer as masking material which can be thickened by using ultraviolet light. After thickening the masking material the coating is applied. After applying the coating remaining masking material in the cooling holes may be removed by burning it off. DE 10 2006 029 070 B3 describes a method for coating a component with cooling holes in which the cooling holes are masked during the coating process. A particle beam is used for coating the component. The masking material is chosen such that it is carried off by the particle beam.

SUMMARY OF INVENTION

With respect to the mentioned prior art it is a first objective of the present invention to provide an advantageous method of masking cooling holes of a turbine component. It is a second objective of the present invention to provide an advantageous method of coating a turbine component. It is a third objective of the present invention to provide an advantageous device for use in a masking process for masking cooling holes in a turbine component and/or in a coating process for coating a gas turbine component.

The first objective is solved by a method of masking cooling holes of a turbine component according to the claims. The second objective is solved by a method of coating an external surface of a turbine component according to the claims and the third objective is solved by a device for use in a masking process for masking cooling holes in a turbine component and/or in a coating process for a turbine component according to the claims. The depending claims describe further developments of the invention.

According to the invention, a method of masking cooling holes of a turbine component for a coating process is provided. The turbine component comprises an external surface to be coated, at least one internal cavity having an opening towards the outside of the component, and cooling holes extending from the at least one internal cavity to the external surface. The inventive method comprises the steps of filling the cooling holes with a masking material and hardening the masking material. According to the invention, water is filled into the cooling holes as the masking material. The hardening is then done by freezing the water to water ice.

Using water ice as masking material offers the advantages that water is a cheap masking material that is easy to apply and easy to remove. Furthermore, water does not entail environmental hazards.

The water may be filled into the cooling holes through the opening of the at least one internal cavity while the cooling holes are sealed at the external surface of the component. By these measures the water can easily flow into the cooling hole so as to match the external surface which results in a smooth surface to be coated after the water has been frozen to water ice.

The freezing of the water can be done by removing heat from the water from the outside of the component. With removing the heat from the outside of the component the water begins to freeze from the external surface of the component towards the inside of the cooling holes. Hence the freezing can be controlled so as to generate a water ice plug of a desired thickness the outside of which is aligned with the external surface. However, the at least one internal cavity may also at least partly be filled with water which freezes during the freezing process. With frozen water also in an internal cavity of the component the plugs in the cooling holes are most stable and cannot move into the internal cavity during the coating process.

In the inventive method of coating an external surface of a turbine component which comprises an external surface to be coated, at least one internal cavity having an opening towards the outside of the component, and cooling holes extending from the at least one internal cavity to the external surface, the cooling holes are masked according to the inventive method of masking cooling holes. Then, the external surface is coated. In doing so coating material is also deposited on the water ice in the cooling holes so as to form coating bridges bridging the cooling holes. After the coating is deposited the water ice is removed by melting it and draining the melted water ice. Then, the coating bridges are removed by applying a pressure pulse to the cooling holes through the at least one internal cavity. The pressure pulse then causes the coating bridges to splinter away. Hence, all cooling holes can be reopened at the same time by simply introducing the pressure pulse into the at least one internal cavity from where it propagates through the cooling holes to the coating bridges.

The pressure pulse may be applied by use of a liquid which is filled into the internal cavity and the cooling holes. Since a liquid is nearly incompressible a pressure pulse can be easily transmitted through the liquid without major losses. Alternatively, the pressure pulse may be applied by use of a gas filled into the internal cavity and the cooling holes. Although the use of a gas for propagating the pressure pulse means higher losses due to compressibility of the gas using a gas offers the advantage that no remainders in the internal cavity or in the cooling holes remain after reopening them.

The melting of the water ice after applying the coating may be assisted by heating the component so as to allow for a faster melting of the water ice plugs and thereby for a higher through-put in the coating process.

The invention further provides a device for use in a masking process for masking cooling holes in a turbine component, in particular for use in an inventive method of masking cooling holes, and/or for use in a coating process for coating a turbine component, in particular for use in the inventive method of coating a turbine component. The turbine component comprises an external surface to be coated, at least one internal cavity having an opening towards the outside of the component, and cooling holes extending from the at least one internal cavity to the external surface. The inventive device comprises a carrier for mounting the component thereto, a seal, a cover, a cooling unit, and a pressure system.

The carrier which may, e.g., comprise an acceptance for a blade root of a turbine blade or vane which allows for mounting the component. The carrier further comprises at least one internal flow channel being connected or connectable to a water supply and having an exit opening. It is adapted to the component such that the exit opening of the flow channel is in flow communication with the opening of the component's internal cavity when the component is mounted to the carrier.

The cover comprises an internal surface with sealing faces. It is adapted to be fitted to the component such that the sealing faces are located at the locations where the cooling holes are present in the external surface and such that the sealing faces rest tightly against the external surface of the component so as to seal the cooling holes against leakage.

The cooling unit serves for reducing the temperature of the cover at least in the area of the sealing faces to a temperature which is below the melting temperature of water ice.

The pressure system is connected or connectable to the carrier and adapted for introducing a pressure pulse into a fluid in the internal flow channel of the carrier. The pressure pulse can then propagate through the fluid to the cooling holes. The inventive device allows for performing the inventive methods and entails therefore the advantages already discussed with respect to the inventive methods.

The inventive device may further comprise a holder which is connectable to the carrier and has a first flow channel and a second flow channel that extends from the first flow channel and has a connection point with the first flow channel by which it is in flow connection with the first flow channel. The first flow channel comprises a first and a second valve, the first valve being upstream of the connection point and the second valve being downstream of the connection point. Furthermore, the first flow channel is connectable to the internal flow channel of the carrier. In addition, the first flow channel is connectable or connected to a water supply and the second flow channel is connectable or connected to the pressure system. In this development of the inventive device, the first flow channel can be used for filling water into the internal cavity while the second flow channel can be used for filling fluid into the internal cavity which shall transmit the pressure pulse. By use of the first valve the water supply can be protected from the pressure pulse. The second valve serves for sealing the carrier against water leaking out of the carrier and the component after filling water into the component.

In a further development of the inventive device the cover comprises at least a first cover part and a second cover part. It further comprises a clamping mechanism for clamping the first cover part and the second cover part against each other after placing them on the component. Implementing the cover by at least a first cover part and a second cover part which may be clamped simplifies mounting and demounting of the cover. By clamping the first cover part and the second cover part against each other the cover can be made tightly fitting to the component.

In a still further development of the device the seal faces of the cover's internal surface are implemented by an elastic material, for example rubber.

The cooling unit of the inventive device may be implemented as a cryogenic unit which supplies a cryogenic agent. In this case the cover comprises internal cooling channels connected or being connectable to the cryogenic unit for receiving and conducting the cryogenic agent through the cover. This implementation of the inventive device provides a simple means for removing heat from the outside of the turbine component.

For speeding up the melting process of the ice in the cooling holes after coating the component the inventive device may further comprise a heater for heating the component. Such a heater may be integrated, attached or attachable to the cover and/or the carrier. In a simple implementation the heater may be just a heating wire or filament. Alternatively, the heater may be a radiant heater.

To increase safeness during providing the pressure pulse the inventive device may be equipped with a pressure retaining shell which can be mounted so as to surround the device. The pressure retaining shell may be, in particular, gas tight.

In all embodiments of the inventive method and the inventive device the turbine component to be coated may be a gas turbine component such as a gas turbine vane or blade.

BRIEF DESCRIPTION OF THE DRAWINGS

Further features, properties and advantages of the present invention will become clear from the following description of an embodiment of the invention in conjunction with the accompanying drawings. Features of the embodiment may as well be advantageous independent of other features or in combination with other features.

DETAILED DESCRIPTION OF INVENTION

Figure 1:
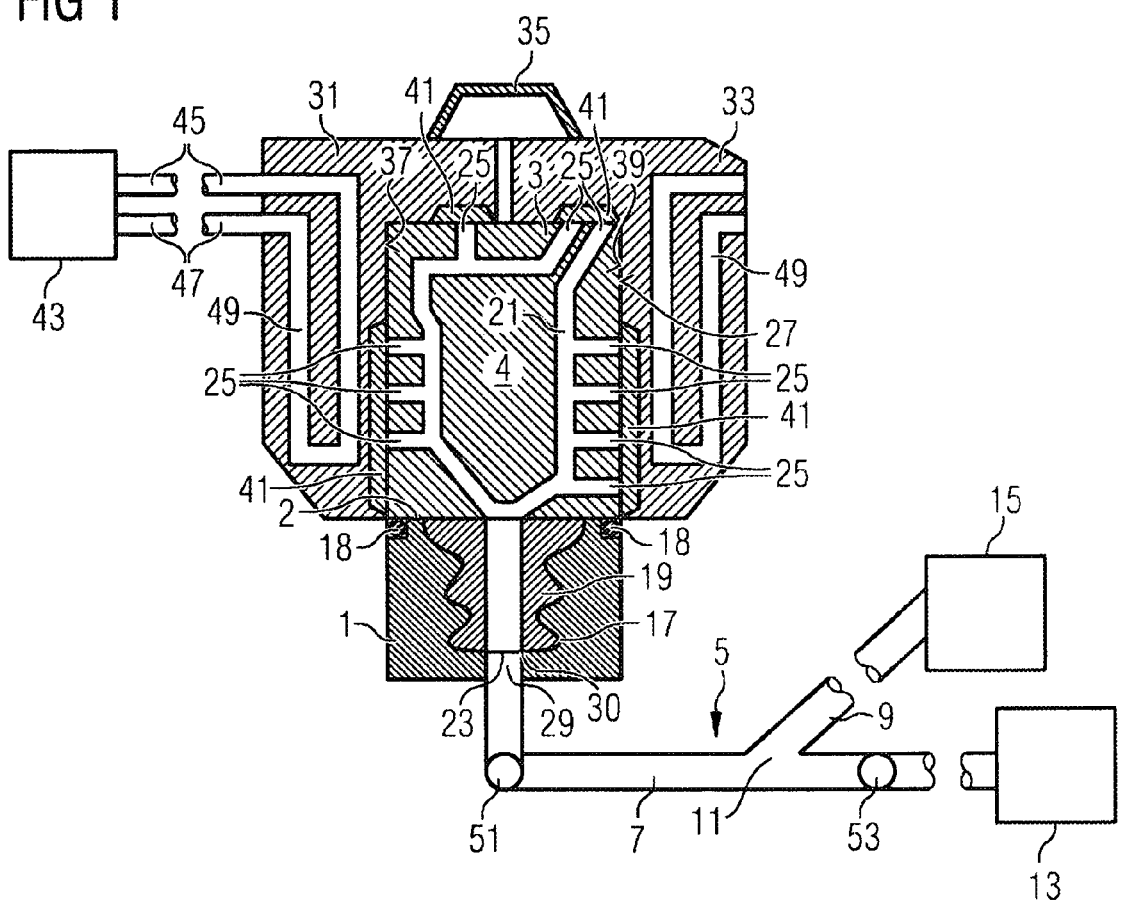
FIG. 1 shows an inventive device during the masking process for the cooling holes of a turbine component.

An inventive device for using in a masking and/or coating process for a turbine component will now be described with respect to FIG. 1. The device comprises a jig 1 which serves as a carrier for carrying the turbine blade 3 as a turbine component to be coated. The jig 1 can be fixed to a holder 5 which comprises a first pipe 7 forming a first flow channel and at least a second pipe 9 forming a second flow channel. The second pipe 9 is connected to the first pipe 7 at a connection point 11 so that those flow channels are in flow connection with each other. While the first pipe 7 leads to a water supply 13 the second pipe 9 leads to a pressure system 15 of the inventive device.

The jig 1 comprises a cavity 17 which is adapted to receive the root 19 of the turbine blade 3. The Blade's airfoil portion 4 remains outside of the jig 1. It's lower side abuts a contact surface 2 of the jig 1. Note, that the blade underside is formed by a platform portion which is, for simplicity reasons, not shown in the figure. A rubber seal 18 is present in the contact surface 2 of the jig 1 for sealing the contact zone in which the jig 1 abuts the turbine blade 3. In the present embodiment, the seal 18 is implemented as a rubber seal ring extending along the edge of the jig's contact surface 2.

An inner cavity 21 is present in the turbine blade 3 and the blade root 19 which has an opening 23 towards the outside of the blade root 19. Furthermore, cooling holes 25 extend from the inner cavity 21 to the external surface 27 of the turbine blade 3. When the turbine blade 3 is operated in a gas turbine cooling air can be introduced into the internal cavity 21 through the opening 23 in the blade root 19. The cooling air then leaves the inner cavity 21 through the cooling holes to form a cooling film over the external surface 27 of the turbine blade 3.

The jig 1 comprises an internal flow channel 29 which is located such that an exit opening 30 of the internal flow channel 29 it is in flow connection with the opening 23 of a blade root inserted into the jig's cavity 17, as it is shown in FIG. 1. Furthermore, the first pipe 7 is connectable to the internal flow channel 29 of the jig 1. FIG. 1 shows the first pipe when it is connected to the internal flow channel 29.

The inventive device further comprises a first cover part 31 and a second cover part 33 which can be placed onto the turbine blade 3 and a clamping mechanism 35 for clamping the first cover part 31 and the second cover part 33 against each other after placing them on the component 3, 19. Internal surfaces 37, 39 of the first cover part 31 and the second cover part 33 comprise rubber seals 41, the surfaces of which are aligned with, or slightly project over, the internal surface 37, 39 of the respective cover part 31, 33. Note that instead of rubber seals other, preferably elastic, seal materials can be used for forming sealing faces in the internal surfaces 37, 39 of the cover parts 31, 33. The sealing faces formed by the rubber seals in the present embodiment are located such in the internal surfaces 37, 39 of the cover parts 31, 33 that they seal the cooling holes 25 in the external surface 27 of the turbine blade 3 against leakage when the cover parts 31, 33 are placed onto the turbine blade 3.

The inventive device further comprises a cooling unit which is implemented in the present embodiment as a cryogenic unit 43. A feed line 45 extends from the cryogenic unit 43, which is located outside of the cover 31, 33 and feeds cooling channels 49 inside the cover parts 31, 33 with a cryogenic agent that can be cooled down in the cryogenic unit 43. The internal cooling channels 49 of the cover 31, 33 are further connected to a return line 47 of the cryogenic unit 43 for supplying used cryogenic agent back to the cryogenic unit 43 for retooling. The temperature of the cryogenic agent fed to the cooling channels 49 by the feed line 45 is set such that the cover 31, 33 cools down below the melting temperature of water.

Figure 2:
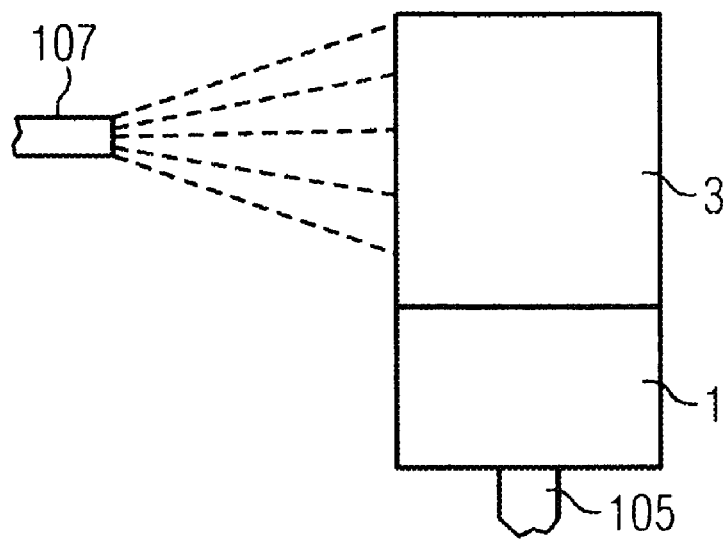
FIG. 2 schematically shows the turbine component during the coating process.
Figure 3:
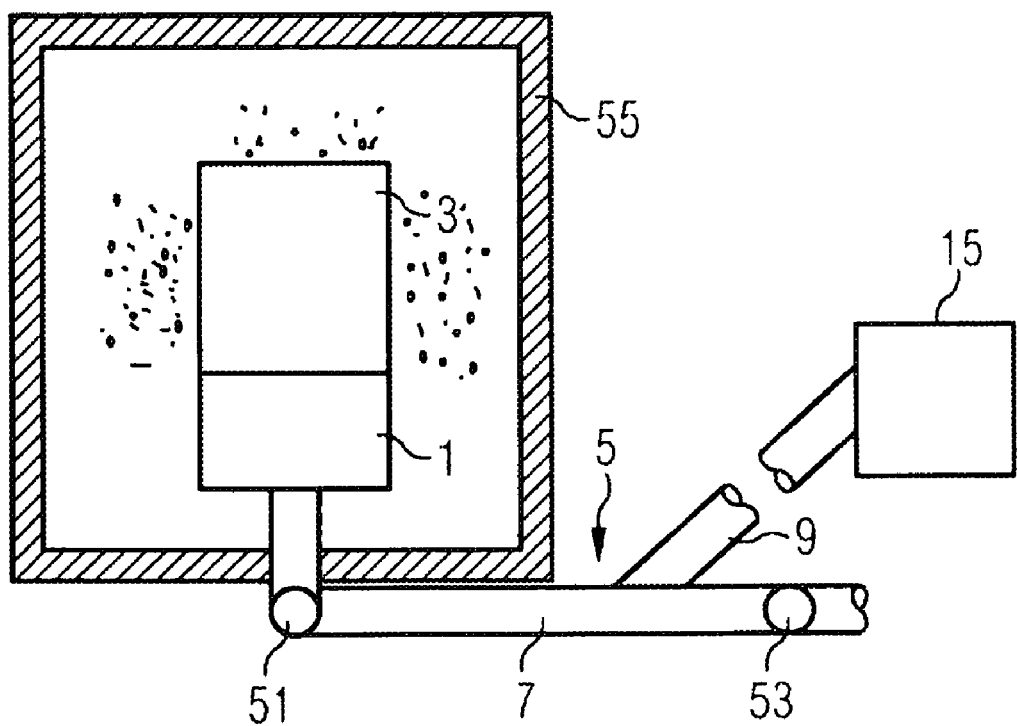
FIG. 3 shows the turbine component during the removal of the coating bridges.

The inventive method of coating an external surface of a turbine component which also includes the inventive method of masking cooling holes of a turbine component will now be described with reference to FIGS. 1 to 3. In these figures, a gas turbine blade will serve as an example for a turbine component to be coated. However, other turbine components like, for example, turbine vanes or liner elements can be masked and coated by the inventive methods, as well.

In a first step, the turbine blade 3 to be coated is placed with its root 19 into the cavity 17 of the jig 1. When the turbine blade 3 is held by the jig 1 the seal 18 seals any possibly occurring gap between the upper side of the jig 1 in FIG. 1 and the underside of the blade's air foil portion 4. The jig 1 may already be connected to the holder 5 when the turbine blade 3 is fixed to the jig 1. However, it is also possible to first fix the turbine blade 3 to the jig 1 and then to fix the jig 1 with the turbine blade 3 connected thereto to the holder 5.

The first and second cover parts 31, 33 are placed onto the turbine blade 3 and are clamped against each other so that both cover parts 31, 33 tightly fit to the turbine blade's airfoil portion 4. When the cover parts 31, 33 are fitted to the turbine blade 3 the rubber seals 41 tightly rest against the cooling holes 25.

When the jig 1 is connected to the holder 5 water from the water supply 13 is filled into the inner cavity 21 of the turbine blade and into the cooling holes 25 through the first pipe 7. This pipe includes two valves which are both open when water is filled into the internal cavity 21. When filling the water into the internal cavity 21 the cooling holes 25 are sealed against leaking of water by the rubber seals 41.

Once the internal cavity 21 and the cooling holes 25 are filled with water the cover 31, 33 is cooled by the cryogenic agent led through the cooling channels 49. Thereby, heat is removed from the water in the cooling holes 25 so that the water freezes—beginning at the outside opening of the cooling hole—towards the internal cavity 21. The freezing process is stopped when the water ice plugs in the cooling holes 25 to have reached a desired thickness. If wanted, the cooling process can be continued until also the water in the internal cavity 21 is frozen.

After the water ice plugs in the cooling holes 25 are formed the cover parts 31, 33 are removed from the turbine blade 3 and the jig 1 still holding the turbine blade 3 is dismantled from the holder 5. The jig with the turbine blade 3 is then fixed to another holder 105 which is part of a coating equipment (see FIG. 2). In the present embodiment, the coating equipment is adapted to perform a thermal spraying process, e.g. flame spraying, arc spraying, or plasma spraying. If a flame spraying equipment is used a high velocity oxygen fuel spraying equipment is particularly suitable.

In addition to the holder 105 the coating equipment comprises a spray gun 107 the orientation of which can be varied with respect to the turbine blade 3. The variation can be either achieved by moving the spray gun 107 relative to the holder 105 to which the jig 1 with the turbine blade 3 is fixed, by moving the holder 105 relative to a fixed spray gun 107, or by moving both.

During the spraying process a coating, for example an MCrAlX-coating and/or a thermal barrier coating is/are applied onto the external surface 27 of the turbine blade's airfoil portion 4. During the coating process coating material is prevented from entering the cooling holes 25 by the water ice plugs. When the coating process is finished the external surface of the turbine blade is completely covered with coating material, except for the root 19 which is located inside the jig 1 and sealed against coating material by the seal 18 which prevents coating material from entering any gap between the jig 1 and the turbine blade's airfoil portion 4.

To assure that the water ice plugs in the cooling holes 25 remain until the coating process is finished the temperature of the cryogenic agent is chosen deep enough to freeze the water well below its melting temperature. The longer the coating process lasts the deeper should the water ice plugs be frozen.

After the coating process is finished the jig 1 with the turbine blade 3 fixed thereto is dismantled from the holder 105 of the coating equipment and again fixed to the holder 5 of the inventive device. Then the turbine blade 3 is allowed to get warm again so that the water ice plugs in the cooling holes 25 and where applicable in the internal cavity 21, melt and drain away. The warming process can optionally be supported by a heater which may, for example, be a filament wrapped around the turbine blade 3 or a radiant heater. However, just waiting until all ice is molten is also possible.

For draining the water, the valve 51 in the first pipe 7 is opened. The water can then be led away by an additional branch pipe (not shown) or by also opening the valve 53 and leading the drained water to the water supply 13. Once the ice plugs are molten the applied surface coating over the cooling holes 25 loses its back support.

When the water is drained away the jig 1 with the coated turbine blade 3 is placed into a pressure retaining and gas tight shell 55 (see FIG. 3) for removing the coating bridges extending over the cooling holes 25. Then, a gas or liquid is filled into the internal cavity 21 and the cooling holes 25 of the turbine blade 3 through the pipe 7 and the branch pipe 9. Next, a pressure pulse which propagates through the gas or liquid in the internal cavity 21 to the cooling holes 25 and to the coating bridges spanning the cooling holes 25 is provided by the pressure system 15. The shock wave of the pressure pulse causes the coating bridges to splinter away from the exits of the cooling holes 25.

The choice of gas or fluid, gas composition, pressure level and pressure characteristics over time decides how efficiently the surface coating can be removed from the exits of the cooling holes 25. For example, the incompressibility of a fluid leads to an efficient propagation of the pressure pulse through such a medium. On the other hand, a gas which is used for transmitting the pressure pulse does not need to be drained from the inside of the turbine blade 3 and can even blow out water that remains in the turbine blade 3.

When the pressure pulse is provided after the turbine blade 3 is filled with the fluid transmitting the pressure pulse the valve 53 in the first pipe 7 is closed in order to protect the water supply 13 from the pressure pulse.

The inventive method and the inventive device allow for temporarily and environmentally friendly closing the cooling holes of a turbine component for protecting them in a surface coating process. The reopening of the cooling holes does not need to be done by reopening the cooling holes one by one. Instead, all cooling holes can be reopened at the same time by the pressure pulse.

The invention claimed is:

1. A method of masking cooling holes of a turbine component for a coating process, the turbine component is a turbine blade or vane, comprising:
   filling the plurality of cooling holes with a masking material; and
   hardening the masking material,
   wherein water is filled in the plurality of cooling holes filling as the masking material and the hardening is done by freezing the water to water ice, and
   wherein the component includes an external surface to be coated, an internal cavity including an opening towards an outside of the component, and the plurality of cooling holes extending from the internal cavity to the external surface.

2. The method as claimed in claim 1, wherein the water is filled into the plurality of cooling holes through the opening of the internal cavity while the plurality of cooling holes are sealed at the external surface of the component.

3. The method as claimed in claim 1, wherein the freezing of the water is accomplished by removing heat from the water from the outside of the component.

4. The method as claimed in claim 1, wherein the internal cavity is at least partly filled with water which freezes during the freezing process.

5. A method of coating an external surface of a turbine component, the turbine component is a turbine blade or vane, comprising:
   masking a plurality of cooling holes of the turbine component according to the method of claim 1;
   coating the external surface thereby depositing coating material onto water ice in the plurality of cooling holes forming a plurality of coating bridges that bridge the plurality of cooling holes;
   removing the water ice after the coating is deposited by melting the coating and draining the melted water ice; and
   removing the plurality of coating bridges by applying a pressure pulse to the plurality of cooling holes through the internal cavity,
   wherein the component includes an external surface to be coated, an internal cavity including an opening towards an outside of the component, and the plurality of cooling holes extending from the internal cavity to the external surface.

6. The method as claimed in claim 5, wherein the pressure pulse is applied to the plurality of cooling holes when the internal cavity and the plurality of cooling holes are filled with a liquid.

7. The method as claimed in claim 5, wherein the pressure pulse is applied to the plurality of cooling holes when the internal cavity and the plurality of cooling holes are filled with a gas.

8. The method as claimed in claim 5, wherein heating the component helps with the melting of the water ice.

9. A device used in a masking process for masking cooling holes in a turbine component, the component is a turbine blade or a turbine vane, the device comprising:
   a carrier for mounting the component, the carrier includes an internal flow channel, connected or connectable to a water supply, the internal flow channel includes an exit opening;
   a cover with an internal surface including a plurality of sealing faces;

a cooling unit for reducing a first temperature of the cover at least in an area of the plurality of sealing faces to a second temperature which is below a melting temperature of water ice; and a pressure system connected or is connectable to the carrier, the pressure system introduces a pressure pulse into a fluid in the internal flow channel of the carrier, wherein the component includes an external surface to be coated, an internal cavity including an opening towards an outside of the component, and the plurality of cooling holes extending from the internal cavity to the external surface, and wherein the carrier is adapted to the component such that the exit opening is in a flow communication with the opening of the internal cavity when the component is mounted to the carrier, and wherein the cover is adapted to fit to the component such that the plurality of sealing faces are located at the locations where the plurality of cooling holes are present in the external surface and such that the plurality of sealing faces rest tightly against the external surface of the component sealing the plurality of cooling holes against leakage.

10. The device as claimed in claim 9, further comprising a holder which is connectable to the carrier, wherein the holder comprises a first flow channel and a second flow channel, wherein the second flow channel extends from the first flow channel and has a connection point with the first flow channel by which the second flow channel is in flow connection with the first flow channel, wherein the first flow channel comprises a first valve and a second valve, the first valve is upstream of the connection point and the second valve is downstream of the connection point, wherein the first flow channel is connectable to the internal flow channel of the carrier and to a water supply, and wherein the second flow channel is connectable or connected to the pressure system.

11. The device as claimed in claim 9, wherein the cover comprises a first cover part, a second cover part, and a clamping mechanism, and wherein the clamping mechanism is used to clamp the first cover part and the second cover part against each other after placing the first cover part and the second cover part on the component.

12. The device as claimed in claim 9, wherein the plurality of seal faces comprise an elastic material.

13. The device as claimed in claim 9, wherein the cooling unit is a cryogenic unit which supplies a cryogenic agent, and wherein the cover comprises a plurality of internal cooling channels connected to or connectable to the cryogenic unit which receives and conducts the cryogenic agent through the cover.

14. The device as claimed in claim 9, further comprising a heater for heating the component.

15. The device as claimed in claim 9, further comprising a pressure retaining shell that surrounds the device.

16. The device as claimed in claim 15, wherein the pressure retaining shell is gas tight.

* * * * *